(12) United States Patent
Dolechek et al.

(10) Patent No.: US 6,830,057 B2
(45) Date of Patent: Dec. 14, 2004

(54) WAFER CONTAINER CLEANING SYSTEM

(75) Inventors: Kert Dolechek, Kalispell, MT (US); Jeffry Davis, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 113 days.

(21) Appl. No.: 10/286,317

(22) Filed: Nov. 1, 2002

(65) Prior Publication Data

US 2004/0084066 A1 May 6, 2004

(51) Int. Cl.$^7$ .................................................. B08B 3/02
(52) U.S. Cl. ...................... 134/148; 134/153; 134/158; 134/166 R
(58) Field of Search ................................. 134/148, 153, 134/158, 166 R, 169 R; 414/937

(56) References Cited

U.S. PATENT DOCUMENTS

| | | |
|---|---|---|
| 3,620,234 A | 11/1971 | Everroad |
| 3,673,042 A * | 6/1972 | Mayers .................. 156/345.17 |
| 4,299,245 A | 11/1981 | Clapper |
| 4,437,479 A | 3/1984 | Bardina et al. |
| 4,736,759 A | 4/1988 | Coberly et al. |
| 4,941,489 A | 7/1990 | Kamimura et al. |
| 5,022,419 A | 6/1991 | Thompson et al. |
| 5,183,644 A * | 2/1993 | Martensson et al. ........ 422/304 |
| 5,224,503 A | 7/1993 | Thompson et al. |
| 5,238,503 A | 8/1993 | Phenix et al. |
| 5,271,774 A | 12/1993 | Leenaars et al. |
| 5,301,700 A | 4/1994 | Kamikawa et al. |
| 5,363,867 A | 11/1994 | Kawano et al. |
| 5,562,113 A | 10/1996 | Thompson et al. |
| 5,698,038 A | 12/1997 | Guldi et al. |
| 5,715,851 A | 2/1998 | Jung et al. |
| 5,738,128 A | 4/1998 | Thompson et al. |
| 5,972,127 A | 10/1999 | Thompson et al. |
| 6,096,100 A | 8/2000 | Guldi et al. |
| 6,248,177 B1 | 6/2001 | Halbmaier |
| 6,267,123 B1 | 7/2001 | Yoshikawa et al. |
| 6,322,633 B1 | 11/2001 | Bexten et al. |
| 6,358,328 B1 | 3/2002 | Yang et al. |
| 6,412,502 B1 | 7/2002 | Bexten et al. |
| 6,446,647 B1 | 9/2002 | Chu et al. |
| 6,660,104 B2 * | 12/2003 | Thompson et al. ........... 134/33 |
| 6,691,718 B2 * | 2/2004 | Bexten et al. ................ 134/80 |

FOREIGN PATENT DOCUMENTS

| | | |
|---|---|---|
| JP | 61-164225 | 7/1986 |
| JP | 61-166134 | 7/1986 |
| JP | 01-111338 | 4/1989 |
| JP | 01-199431 | 8/1989 |

* cited by examiner

Primary Examiner—Randy Gulakowski
Assistant Examiner—Saeed T Chaudhry
(74) Attorney, Agent, or Firm—Perkins Coie LLP

(57) ABSTRACT

A system and method for cleaning boxes used for handling flat media includes a rotor rotatably mounted within an enclosure, with spray nozzles in the enclosure for spraying fluid toward the rotor. The rotor has at least one box holder assembly for holding a box. At least one retainer bar is located on the rotor for engaging a front section of the box to retain the box in the box holder assembly during rotation of the rotor. The retainer bar is preferably moveable from a first position where the retainer bar restrains the box on the box holder assembly, to a second position where the retainer bar is moved away from the box. The box holder assembly may alternatively include a base with a plurality of grooved elements thereon that are adapted to engage a flange on the box for securing the box to the box holder assembly.

12 Claims, 6 Drawing Sheets

WAFER CONTAINER CLEANING SYSTEM

BACKGROUND OF THE INVENTION

The field of the invention is cleaning apparatus for cleaning carriers used to hold and transport semiconductor wafers and similar flat articles requiring low contamination levels.

The processing of semiconductor wafers, substrates, photomasks, flat panel displays, data disks, optical and MEMS media and other flat articles (collectively referred to here as "wafers") is very sensitive to contamination. These articles require extremely low contamination levels. Even microscopic contaminants can cause defects. Accordingly, it is necessary to maintain a high level of cleanliness during virtually all stages of manufacture.

Wafers are typically processed in batches. Batch handling may occur throughout the entire production process, or for one or more processing steps or related handling operations. Batch processing usually uses a carrier to hold the wafers. The wafer carriers can be of various designs and are generally a protective case or box optionally including a removable door. These carriers or boxes are known as FOUPs, FOSBYs or cassettes. In these types of carriers, the wafers are held and enclosed, to protect them from contamination during movement and storage within the processing facility. After each use, the wafer carriers must generally be cleaned to avoid having particles and contaminants on the carriers contaminate the wafers. Cleaning the boxes, however, can be difficult because they typically have features such as slots, grooves, and/or apertures.

Carriers have been successfully cleaned in centrifugal cleaners. See, for example, U.S. Pat. No. 5,738,128 incorporated herein by reference. In these centrifugal cleaners, the box is loaded onto a rotor, with the open front side of the box facing radially outwardly from the rotor. The box is then sprayed with cleaning fluids, and then with drying gases, while the rotor turns. Centrifugal force helps to remove cleaning fluids from the box, to help dry it. While these techniques have worked well for different types of boxes, disadvantages remain in loading, holding and unloading especially larger size carriers.

Another engineering challenge is that carrier doors in current systems are generally cleaned separately from the boxes themselves. Accordingly, matching the doors back with their respective boxes after cleaning is often difficult, error prone, and time consuming. Thus, there is a need for a system that efficiently cleans carriers, as well as a system that cleans carriers and carrier doors together.

SUMMARY OF THE INVENTION

In a first aspect of the invention, a system for cleaning carriers used for holding flat media or wafers includes a rotor rotatably mounted within an enclosure. Spray nozzles in the enclosure spray fluid toward the rotor. The rotor has at least one box holder assembly for holding a box, such as a FOUP or FOSBY. At least one retainer bar is located on the rotor for engaging a front section of the box to retain the box in the box holder assembly during rotation of the rotor. In a preferred embodiment, the retainer bar is moveable from a first position where the retainer bar restrains the box on the box holder assembly, to a second position where the retainer bar is moved away from the box. This design provides for quick, reliable and ergonomic loading, securing and unloading of boxes.

In a second aspect of the invention, the box holder assembly includes a base for supporting a box. The base includes a plurality of grooved elements that are adapted to engage a flange on the box for securing the box to the box holder assembly.

In a third aspect of the invention, a method of cleaning a box used for handling flat media includes loading a box into a box holder assembly on a rotor preferably via handles on the box. A retainer bar is then moved into engagement with the box to secure the box into the box holder assembly before rotating and spraying the box. The boxes are securely held in the rotor.

In a fourth aspect of the invention, a method of cleaning a carrier having a box with a removable door includes separating the door from the box and loading the box into a box holder assembly on a rotor. The door is then loaded into a door holder assembly attached to and alongside of the box holder assembly. Since each door remains next to its box at all times, matching doors and boxes after cleaning is greatly simplified.

In a fifth aspect of the invention, a rotor for holding and rotating boxes during cleaning of the boxes includes a top plate and a base plate. A plurality of columns of box holder assemblies or ladders are attached between the top plate and the bottom plate. The box holder assemblies in each column have open front ends which are oriented perpendicularly to the box holder assemblies of the neighboring or adjacent columns. This provides for a more compact apparatus.

In a sixth aspect of the invention, a rotor for holding and rotating boxes during cleaning of the boxes includes a top plate and a base plate. A plurality of box holder assemblies are located between the top plate and the bottom plate. Each box holder assembly includes a base plate or other means for holding a box, and a door plate or other means for holding a door, with the door plate attached to the base plate. Each box door is cleaned while remaining adjacent to the box the door came from.

Other and further objects, inventive features, and advantages, will appear hereinafter. The invention resides as well in subsystems and subcombinations of the features described. While various additional elements are discussed in the following detailed description, these elements are not essential to the invention.

BRIEF DESCRIPTION OF THE DRAWINGS

In the drawings, wherein the same reference number denotes the same element, throughout the several views.

DETAILED DESCRIPTION OF THE DRAWINGS

Figure 1:
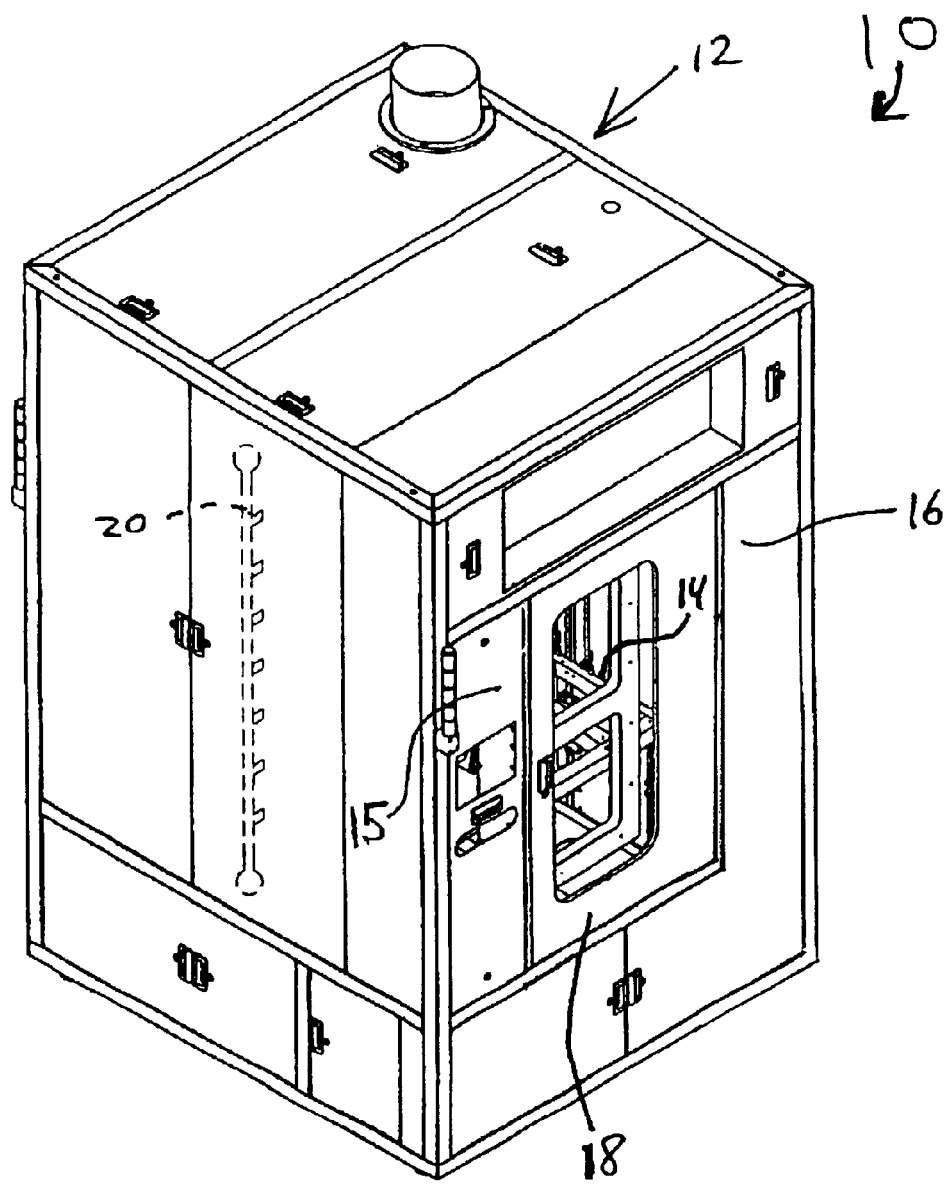
FIG. 1 is a perspective view of a system for cleaning carrier boxes used in handling wafers and similar flat articles.

Turning now in detail to the drawings, as shown in FIG. 1, a carrier cleaning system 10 includes a centrifugal box cleaner 12 for cleaning carriers, such as FOUP carriers. A carrier door cleaner may be provided separately, or may be included in the centrifugal cleaner 12, as described below.

According to a first preferred embodiment, a rotor assembly 14 is rotatably supported within an enclosure 16 of the box cleaner 12. The rotor assembly 14 is accessed via an enclosure door 18, which slides or pivots open for loading and unloading, and is closed during cleaning. At least one spray manifold 20 (shown in phantom in FIG. 1), including one or more spray nozzles, is located in the enclosure for spraying fluid toward the rotor to clean and rinse carrier boxes supported on the rotor. Typically each manifold will have many nozzles, and several inner and outer manifolds are provided.

Figure 2:
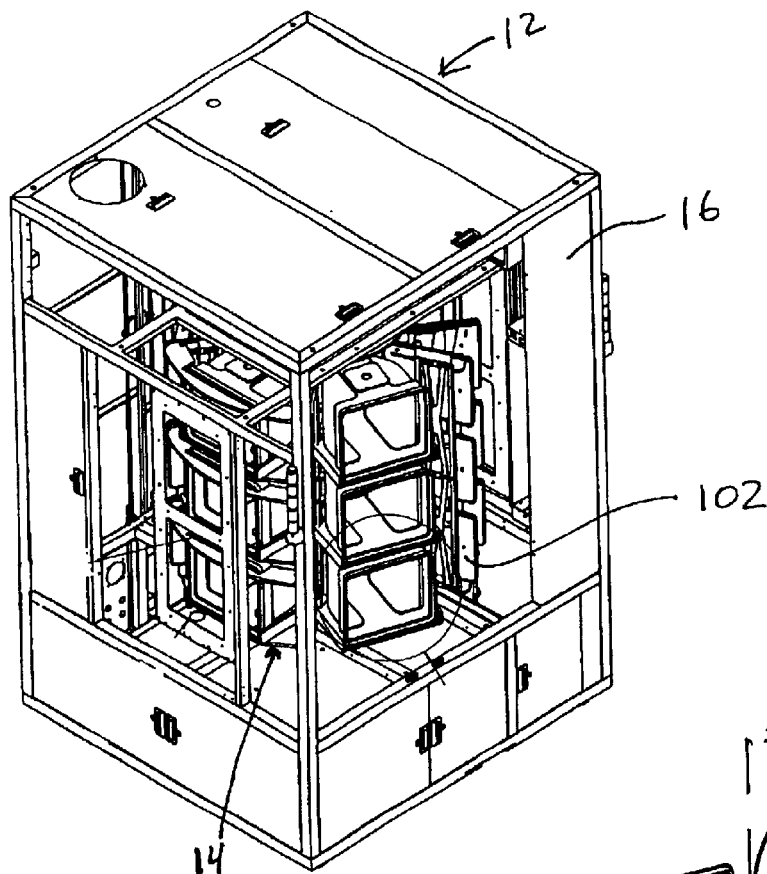
FIG. 2 is a perspective view of a rotor within the box cleaning system shown in FIG. 1.
Figure 3:
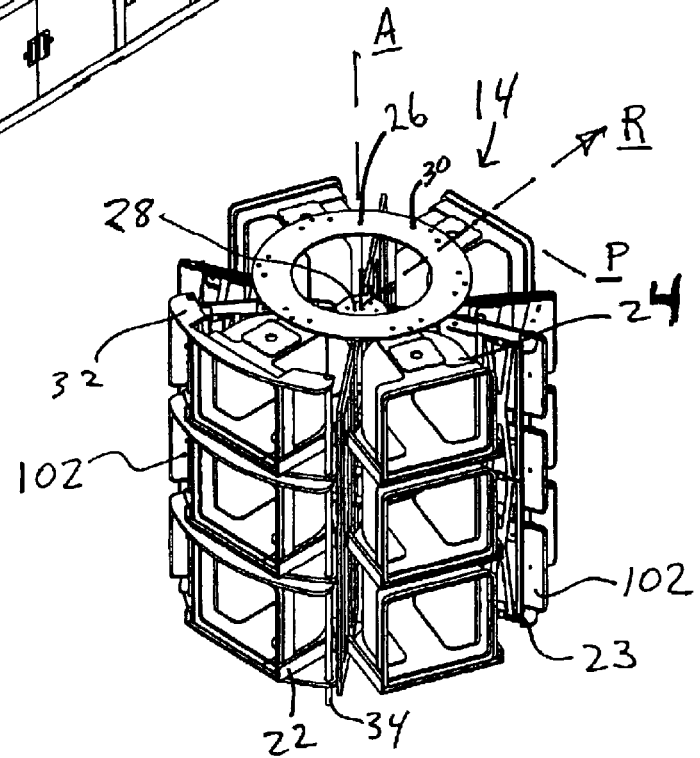
FIG. 3 is a perspective view of the rotor shown in FIG. 2.

Turning to FIGS. 2 and 3, the rotor assembly 14 is shown within the enclosure 16 and in isolation. The rotor assembly 14 includes a plurality of radially outwardly facing box holder assemblies 22 each having preferably 2, 3, 4 or more vertically stacked up. In FIGS. 2 and 3, the rotor assembly 14 is shown having four columns of box holder assemblies, with each column including three box holder assemblies 22, for supporting a total of twelve carrier boxes 24. For example, the top box holder assembly in each column may be eliminated to provide a shorter rotor assembly, such that the rotor assembly includes a total of eight box holder assemblies 22 (i.e., four columns each having two box holder assemblies).

The box holder assemblies 22 are attached to, and form part of, the rotor assembly 14 within the box cleaner 12. The rotor assembly 14 has a top ring plate 26 and a bottom ring plate (not visible in the drawings) attached to a core structure 28. The box holder assemblies 22 are rigidly attached to the ring plates via bolts 30, screws, or other suitable attachment means.

Door holding ladders or frames are also attached to the ring plates 26. Each door holding ladder 23 has positions for holding a door of a carrier. Each ladder 23 is preferably adjacent to a box bolder assembly, to simplify matching up doors and boxes after cleaning.

Figure 5:
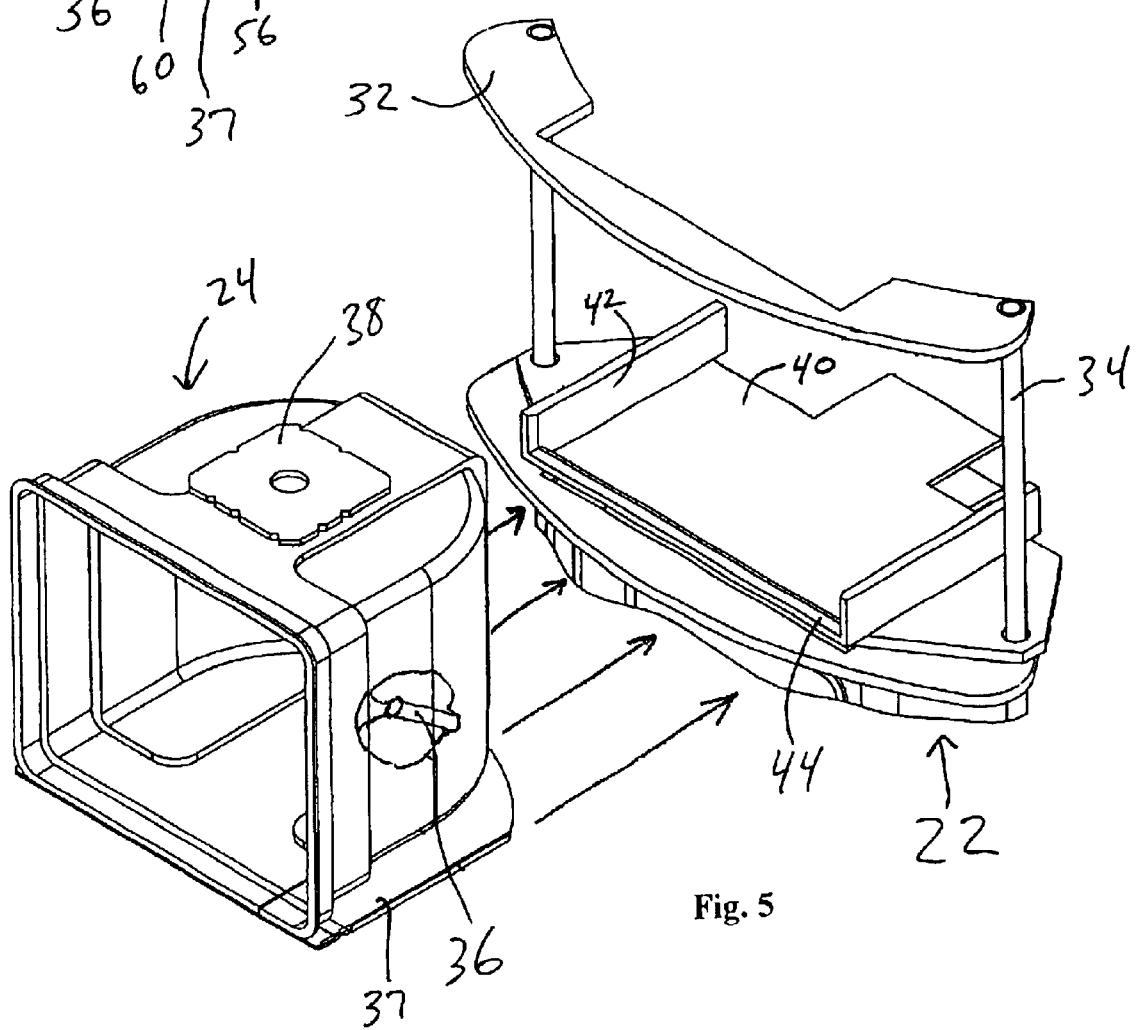
FIG. 5 is a perspective view of a first preferred loading sequence of a carrier box moving into a box holder assembly.

As is best illustrated in FIG. 5, each box holder assembly 22 preferably includes a base plate 40 attached to the rotor assembly 14 via welds, screws, or other suitable attachment means. The base plate 40 has a pair of vertically extending side guides 42 for guiding a carrier box 24 into the box holder assembly 22. The base plate 40 further includes a raised lip 44 at a front section thereof for holding a box 24 on the box holder assembly 22, and for preventing clocking or angular shifting of the box 24 about an axis, during rotation of the rotor assembly 14.

Figure 7:
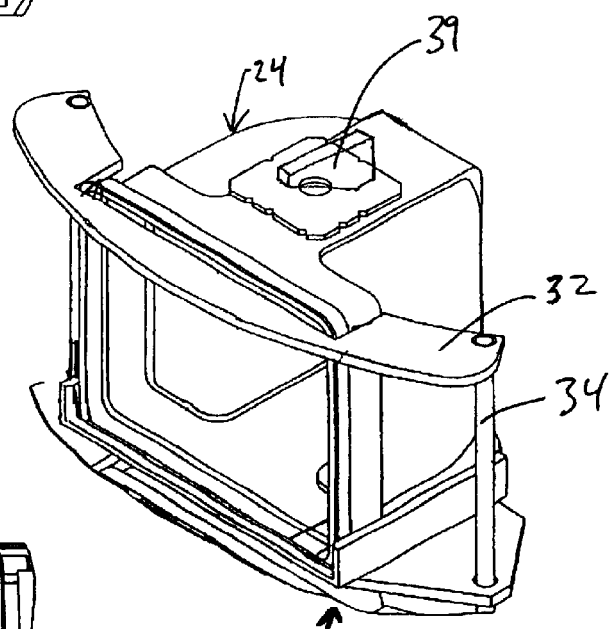
FIG. 7 is a perspective view of a carrier box secured in a box holder assembly.

The rotor assembly 14 includes a retainer mechanism for securing boxes 24 to their respective box holder assemblies 22 during rotation of the rotor assembly 14. The retainer mechanism includes a plurality of retainer plates or bars 32, with one retainer bar 32 aligned over each box holder assembly 22 on the rotor assembly 14. In a preferred embodiment, each retainer bar 32 is substantially C-shaped so that it may engage three sides of a box 24, as illustrated in FIG. 7, thereby constraining the box 24 in three directions during rotation of the rotor assembly 14.

Figure 6:
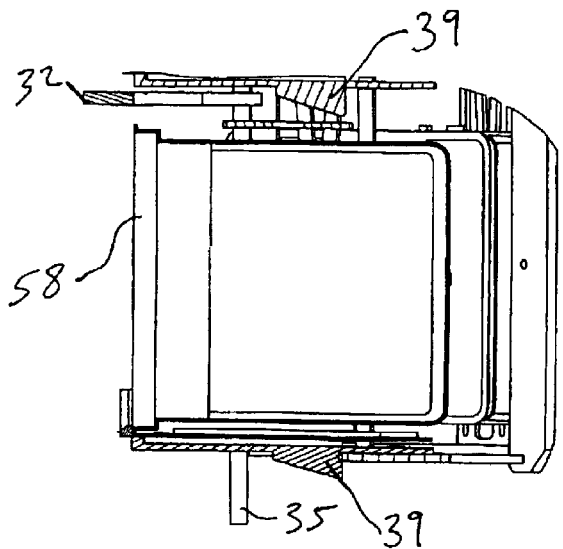
FIG. 6 is a side view of a carrier box loaded into an open box holder assembly on a lower level of a rotor.

Each retainer bar 32 is preferably attached to a pair of vertically extending arms 34 located on opposite sides of each column of box holder assemblies 22. The retainer mechanism is preferably raised and lowered by an actuator 35, which is located at the bottom of the rotor assembly 14, as illustrated in FIG. 6. In a preferred embodiment, the actuator 35 engages the retainer mechanism via a sealed passthrough shaft and receiver. Alternatively, each retainer bar can be separately moved by hand.

The rotor assembly 14 further includes an angled guide 39 attached thereto and positioned above each box holder assembly 22. The angled guide 39 is located between the retainer bar 32 and the central axis of the rotor assembly 14 such that, 24 when a box 24 is positioned on the box holder assembly 22, the angled guide 39 is aligned over the top of the box 24, as illustrated in FIG. 7. The angled guide 39, accordingly, limits or prevents upward movement of the box 24 after the box 34 is placed into the box holder assembly.

Figure 9:
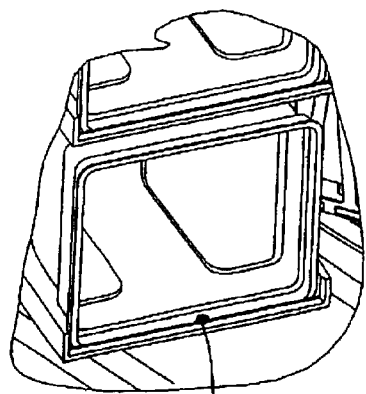
FIG. 9 is a close-up view of a carrier box with a sensor thereon.

The rotor assembly 14 preferably includes one or more sensors for indicating when boxes 24 are properly loaded and retained in the box holder assemblies 22. Sensors may also be positioned on the rotor assembly 14 to indicate when a box holder assembly 22 is open for loading/unloading a carrier box 24, or closed for cleaning a box 24. As illustrated in FIG. 9, one or more sensors 62 may additionally be located on or in each of the box holder assemblies 22 to indicate whether or not a box 24 is present and/or properly positioned in the box holder assembly 22. Conventional laser sensors, or other suitable sensing devices, may be employed to perform these sensing functions.

Figure 4:
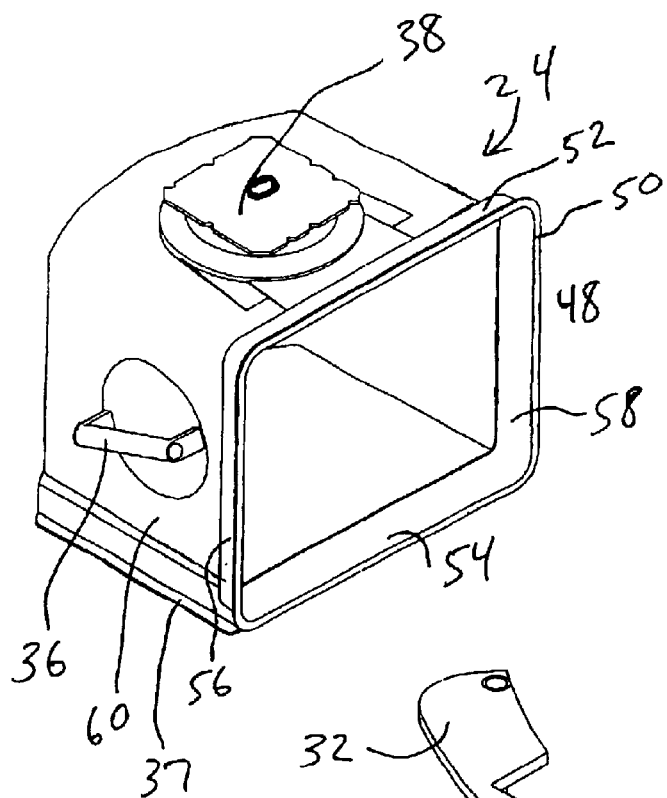
FIG. 4 is a perspective view of a carrier box.

A variety of standard carriers used in the semiconductor wafer processing industry, such as FOUP carriers, may be cleaned in the rotor assembly 14. The box component of the carrier 24, as illustrated in FIGS. 4 and 5, has an open front 48 surrounded by a frame 50. The frame 50 has a top rim 52, a bottom rim 54, a left side rim 56, and a right side rim 58. Handles 36 are attached to side walls 60 of the carrier box 24. A flange 37 forms the base of the carrier box 24. A fitting 38 may be attached to the top surface of the carrier box 24, for engagement by a robot or other automatic manipulator. The door component of the carrier is generally flat and has moveable lugs or fittings which engage and disengage with matching features on the box.

In use, carriers 24 to be cleaned are transported to the container cleaning system 10. A system (human) operator typically lifts a carrier box 24 from a cart and removes the door from the carrier box 24. To load the carrier 24 into the box cleaner 12, the operator turns the rotor assembly 14, via a control panel, until an empty box holder assembly 22 is aligned with the opening of the enclosure door 18. The enclosure door slides open and closed automatically via operator control of the control panel.

The operator, preferably holding the carrier box 24 by the handles 36, then slides the carrier box 24 over the lip 44 and between the side guides 42 of the box holder assembly 22, in the direction shown in FIG. 5. Once the carrier box 24 clears the lip 44 and comes to rest on the base plate 40, as illustrated in FIG. 6, additional carrier boxes 24 may be loaded into the remaining open box holder assemblies 22.

Figure 8:
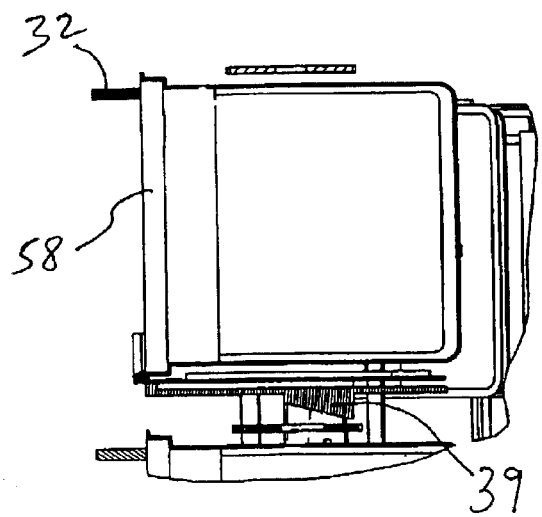
FIG. 8 is a side view of a carrier box secured in a box holder assembly on an upper level of a rotor assembly.

Once the box holder assemblies 22 are loaded with carrier boxes 24, the operator, via the actuator 35, lowers the retaining mechanism. Each retainer bar 32 engages the top of the frame 50 of its respective carrier box 24, as illustrated in FIGS. 7 and 8. In a preferred embodiment, the retainer bar 32 engages the front face and the side rims 56, 58 of the carrier box 24, as illustrated in FIG. 7. The carrier box 24 is preferably further engaged by the side guides 42 and the lip 44 on the base 40, and by the angled guide 39 above on the rotor assembly 14. Accordingly, the carrier box 24 is secured into the box holder assembly 22 such that it cannot shift during subsequent rotation of the rotor assembly 14. The rotor is then indexed or rotated to align a next set of holder assemblies 22 with the door. This procedure continues until the rotor is preferably fully loaded.

Before starting the cleaning process, the operator checks to ensure that none of the carrier boxes 24 are loaded improperly, preferably via the sensors on the rotor assembly 14 and/or on the box holder assemblies. If a carrier box 24 is loaded improperly, such that it protrudes out of the box holder assembly 22, for example, the operator can then adjust the box 24 by hand.

When each of the box holder assemblies 22 is properly loaded with a carrier box 24, or when there are no further boxes 24 to be cleaned, the operator closes the enclosure door 18 and initiates the cleaning sequence via a control panel 15. The rotor assembly 14 spins and cleaning fluids (typically water optionally including detergent) are sprayed onto the carrier boxes 24. Heated air, optionally along with drying gases may then be used to dry the carrier boxes 22, as described, for example, in U.S. Pat. No. 5,738,128. After the carrier boxes 24 have been cleaned and dried, they are unloaded and removed from the box cleaner 12 following the reverse of the sequence of steps described above.

The doors of the box carriers 24 may be cleaned in a separate cleaning apparatus, such as the centrifugal cleaner described in U.S. Pat. No. 6,412,502, incorporated herein by reference. The doors may then be matched up with their after cleaning respective carrier boxes.

Generally, each door should be returned and attached to the box it came off of. FIGS. 10–14 show a second preferred rotor assembly 100, used for simultaneously cleaning in combination both the carrier boxes 24 and the doors 102, is shown. The rotor assembly 100 may be used in the centrifugal box cleaner 12 described above in place of the first rotor assembly 14 described above. An essential element or characteristic of this design is that each box holding position has an associated door holding position next to it. This allows each box and its door to be kept together, so that they can be easily matched up after cleaning. Mixing up doors and boxes, or the need for uniquely identifying and matching each door to its box after cleaning, is reduced or eliminated. The other features in FIGS. 10–14 described below may be preferred but are not essential.

Figure 11:
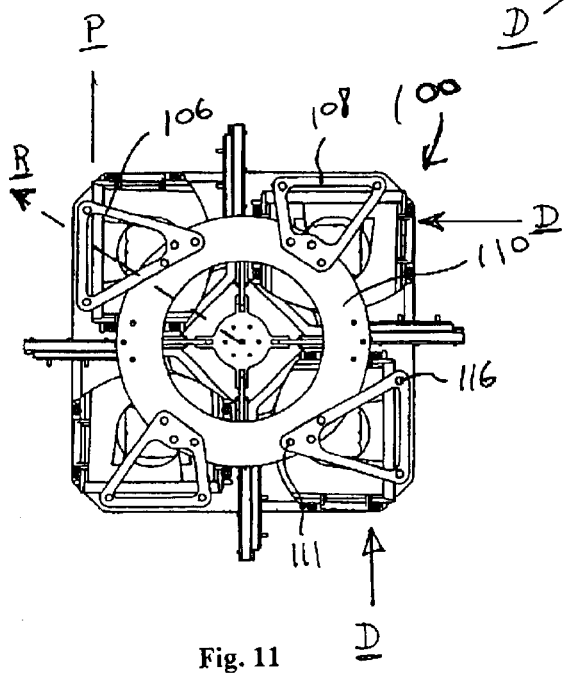
FIG. 11 is a top view of the rotor assembly shown in FIG. 10.

The rotor assembly 100 includes a plurality of columns of box holder assemblies 104 oriented substantially perpendicularly to one another as shown in FIG. 11, as opposed to the radially outwardly facing configuration of the rotor assembly 14 shown in FIG. 3. In a preferred embodiment, four columns, having two box holder assemblies 104 each, are included on the rotor assembly 100. Different numbers and configurations of box holder assemblies 104 may be used.

Figure 10:
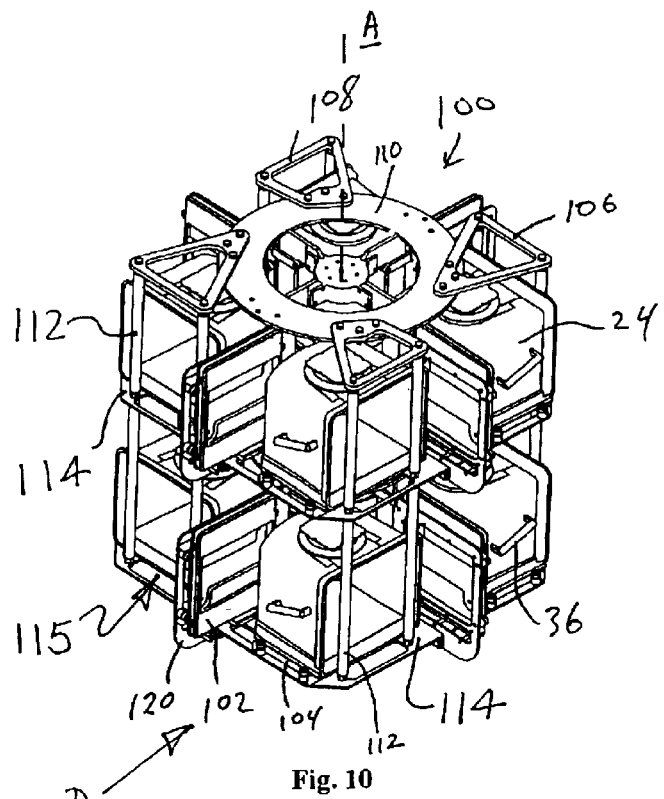
FIG. 10 is a perspective view of an alternative rotor assembly having columns of box holder assemblies oriented perpendicularly to one another.

The box holding positions 115 formed by the assemblies 104 in FIG. 10, are rotated about 45° relative to the positions shown in FIG. 3. In this "perpendicular" orientation the plane P formed by the frame 50 of a box held in the rotor forms an acute angle (e.g., 35–55, 40–50, or about 45 degrees) with a radius R extending from the axis of rotation AA. In contrast, in FIG. 3, P and R are perpendicular.

Figure 12:
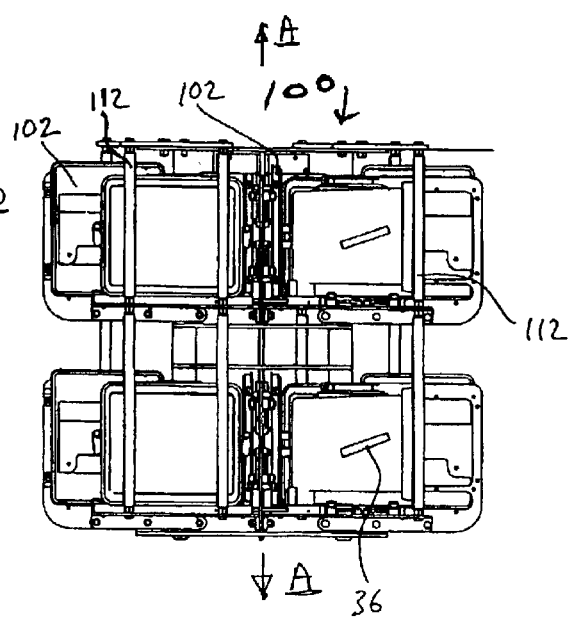
FIG. 12 is a side view of the rotor assembly shown in FIG. 10.

As illustrated in FIGS. 10–12, the rotor assembly 100 includes a plurality of outwardly extending brackets 106, 108 attached to a top ring 110 via bolts 111, screws, or other suitable fastening means. One or more retainer bars 112 extend downwardly from each bracket 106, 108 to a base 114 of the box holder assembly 104 located below the bracket. The base 114 preferably includes holes 118 into which the retainer bars 112 may be screwed or otherwise attached. Two retainer bars 112 are preferably used. The retainer bars 112 are advantageously coated with Teflon (florine containing resins) or a similar material.

A door holder assembly 120 is preferably attached to each box holder assembly 104 via bolts, screws, or other suitable attachment means. The door holder assembly 120 is preferably oriented perpendicularly to the base 114 of box holder assembly 104 for holding a door 102 in a vertical orientation.

Each box holder assembly 104 preferably includes a pair of base guides 122. A pair of inner grooved elements, such as grooved rollers 124 or v-wheels are located at the end of the base guides 122 located near the door holder assembly 120. Each of the inner grooved rollers 124 is attached to a top surface of a pivotable arm or lever 126. Each pivotable lever 126 is biased in a direction away from the door holder assembly 120 by a spring 128 or similar mechanism.

Figure 13:
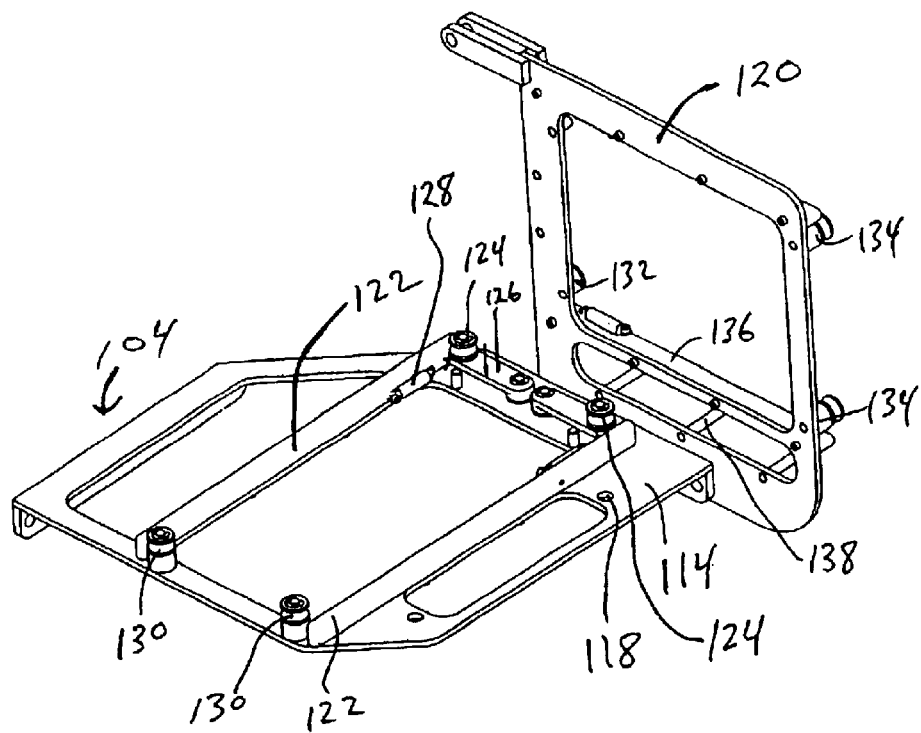
FIG. 13 is a perspective view of a box holder assembly attached to a door holder assembly, with the box holder assembly and the door holder assembly having grooved elements for engaging a flange on a box and a door, respectively.
Figure 14:
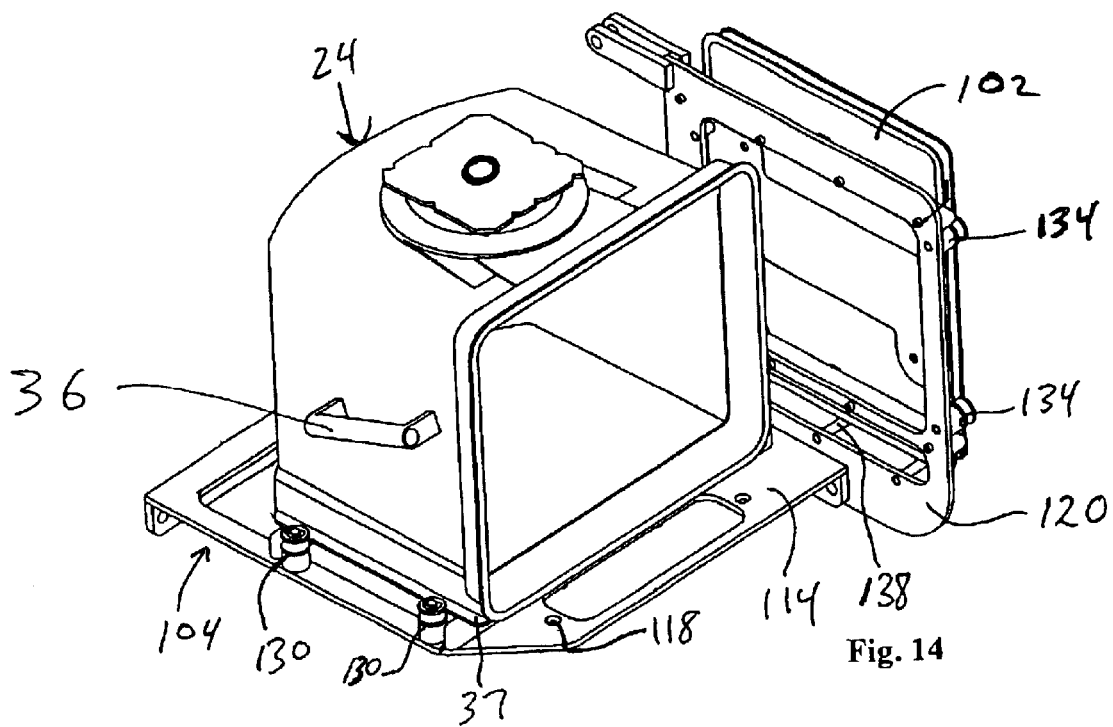
FIG. 14 is a perspective view of the box holder assembly and door holder assembly of FIG. 13 with a box and a door installed.

Referring still to FIG. 13, a pair of outer grooved elements, such as grooved rollers 130 or v-wheels, are fixed to the base 114 at the opposite end of the base guides 122. Similarly, each door holder assembly 120 preferably includes a pair of spring-loaded grooved rollers 132 located toward the core of the rotor assembly 100, and a pair of fixed grooved rollers 134 located toward the outer end of the door holder assembly 120. The door holder assembly 120 includes a pair of guides 136 for guiding a door 102 into the inner grooved rollers 132. Teflon-coated pins 138 are preferably provided on the door holder assembly 120 for supporting the weight of a door 102.

In use, a (human) operator removes a door 102 from a carrier box 24 and sets the door 102 aside. The operator then grasps the carrier box by its handles 36 and slides the bottom of the carrier box 24 along the base guides 122 until the flange 37 of the carrier box is secured between the inner grooved rollers 124. The carrier box is preferably moved along the base guides in a sideways (in direction D in FIGS. 16 and 14, tangent to the ring 110) manner such that the front of the carrier box 24 faces the retainer bars 112. To load a box 24 in this manner, the operator grasps the outward facing handle 36 with one hand, and places a second hand underneath the box 24 to lift the box 24 onto the side guides 122.

The operator continues to press the carrier box against the inner grooved rollers 124 until the levers 126 pivot, which stretches the springs 128 such that the outer portion of the carrier box passes beyond the outer fixed grooved elements 130. The outer portion of the carrier box 24 is then lowered onto the base guides 122, and the box 24 is released by the operator. As a result, the spring-loaded inner grooved rollers 124 force the flange 37 of the carrier box 24 into engagement with the fixed outer grooved rollers 130 such that the carrier box 24 is secured between the grooved rollers. The operator then preferably pushes the box 24 forward within the rollers 124, 130 such that the front of the carrier box 24 moves into engagement with the retainer bars 112.

The operator loads the door 102 into the door holder assembly in a manner similar to that employed for loading the carrier box 24 into the box holder assembly 104. The door is preferably loaded along the guides 136 into the spring-loaded grooved rollers 132, which then force the door back into engagement with the fixed grooved rollers 134, such that the door 102 is secured between the grooved rollers 132, 134.

Additional carrier boxes 24 and doors 102 may then be loaded into the rotor assembly 100 in the same manner. When all of the box holder assemblies 104 and door holder assemblies 120 are loaded, or when there are no further boxes 24 and doors 102 to be cleaned, the operator closes the enclosure door 18 and initiates the cleaning sequence described above. When the cleaning process is completed, the carrier boxes 24 and the doors 102 are unloaded from the rotor assembly 100 using the reverse of the sequence of steps described above.

Because the carrier boxes 24 and their respective doors 102 stay next to each other throughout the cleaning process, it is very easy to match up the boxes 24 with the doors 102 after cleaning.

The box holder assemblies are preferably constructed from stainless steel plates or similar materials. The plates may be bolted or screwed together, as well as bolted or screwed to the rotors themselves, which reduces the need for much of the complicated welding and special machining operations required by existing designs. Additionally, because these structures are relatively simple compared to existing designs, fewer parts and less adjustment are required. Loading and unloading of the carrier boxes into and out of the box holder assemblies is also simpler than in existing designs.

Additionally, because the carrier boxes are loaded in an upright orientation via handles, there is no need to touch the inner surfaces of the carrier boxes, or to manipulate the boxes, as is typically done in existing designs. Accordingly, contamination is reduced. The rotor also provides ergonomic improvements, as it makes it easier for the operator to load and unload boxes.

While embodiments and applications of the present invention have been shown and described, it will be apparent to one skilled in the art that other modifications are possible without departing from the inventive concepts herein. The invention, therefore, is not to be restricted except to the following claims and their equivalents.

What is claimed is:

1. A system for cleaning boxes used for handling flat media, comprising:

a rotor rotatably mounted within an enclosure;

spray nozzles in the enclosure for spraying fluid toward the rotor;

at least one box holder assembly on the rotor for holding a box; and at least one retainer bar on the rotor for engaging a front section of the box to retain the box in the box holder assembly during rotation of the rotor.

2. The system of claim 1 wherein the retainer bar is moveable vertically and is substantially C-shaped for engaging the front section and two side sections of the box when the box is positioned in the box holder assembly.

3. The system of claim 1 further comprising at least one sensor on at least one of the rotor and the box holder assembly for indicating at least one of when a box is present on the box holder assembly, when a box is properly loaded into the box holder assembly, and when the box holder assembly is open for loading/unloading or closed for cleaning.

4. The system of claim 1 further comprising a plurality of grooved rollers on the box holder assembly for engaging a flange on a bottom surface of the box to secure the box to the box holder assembly.

5. The system of claim 1 further comprising a door holder assembly attached to the box holder assembly for securing a door of a box to the rotor.

6. The system of claim 5 further comprising a plurality of grooved rollers on the door holder assembly for engaging the door to secure the door to the door holder assembly.

7. A system for cleaning boxes used for handling flat media, comprising:

a rotor rotatably mounted within an enclosure;

spray nozzles in the enclosure for spraying fluid toward the rotor;

at least one box holder assembly on the rotor for supporting a box; and a retainer bar on the rotor moveable from a first position where the retainer bar restrains the box on the box holder assembly, to a second position where the retainer bar is moved away from the box.

8. The system of claim 7 wherein the box holder assembly includes a base and a lip at a front section of the base for retaining the box on the base and for preventing the box from rotating about an axis.

9. The system of claim 8 further comprising side guides on the base for guiding the box into the box holder assembly.

10. The system of claim 7 wherein the retainer bar is substantially C-shaped for engaging a front section and two side sections of the box when the box is positioned in the box holder assembly.

11. The system of claim 7 further comprising an actuator on the rotor for raising and lowering the retainer bar.

12. The system of claim 7 further comprising an angled guide attached to the rotor above the box holder assembly between the retainer bar and a central axis of the rotor, the guide configured to engage a top section of the box when the box is positioned in the box holder assembly.

* * * * *